United States Patent
Wu

(10) Patent No.: US 9,166,103 B2
(45) Date of Patent: Oct. 20, 2015

(54) SINGLE-CHIP TWIN LIGHT SOURCE LIGHT EMITTING DEVICE

(71) Applicant: UNITY OPTO TECHNOLOGY CO., LTD., New Taipei (TW)

(72) Inventor: Ching-Huei Wu, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 0 days.

(21) Appl. No.: 13/921,389

(22) Filed: Jun. 19, 2013

(65) Prior Publication Data

US 2014/0299836 A1    Oct. 9, 2014

(30) Foreign Application Priority Data

Apr. 9, 2013 (TW) .............................. 102112502 A

(51) Int. Cl.
*H01L 29/06* (2006.01)
*H01L 33/08* (2010.01)
*H01L 25/075* (2006.01)
*H01L 27/15* (2006.01)

(52) U.S. Cl.
CPC .............. *H01L 33/08* (2013.01); *H01L 25/0753* (2013.01); *H01L 27/153* (2013.01)

(58) Field of Classification Search
CPC .................. H01L 25/0753; H01L 33/504
USPC ............................................................ 257/89
See application file for complete search history.

(56) References Cited

U.S. PATENT DOCUMENTS

| 7,381,995 B2 * | 6/2008 | Tain et al. ...................... 257/82 |
| 8,592,847 B2 * | 11/2013 | Chen et al. ..................... 257/98 |
| 8,796,676 B2 * | 8/2014 | Pieh et al. ....................... 257/40 |
| 2012/0153318 A1 * | 6/2012 | Wu et al. ......................... 257/89 |
| 2014/0009918 A1 * | 1/2014 | Kubota et al. ................. 362/154 |

* cited by examiner

*Primary Examiner* — Fernando L Toledo
*Assistant Examiner* — Neil Prasad
(74) *Attorney, Agent, or Firm* — Rosenberg, Klein & Lee

(57) ABSTRACT

Disclosed is a single-chip twin light source light emitting device including a first epitaxial layer, a substrate, and a second epitaxial layer. The first epitaxial layer includes a first n-type semiconductor layer with a n-type conducting structure, a first light emitting layer with a multi-quantum well structure, and a first p-type semiconductor layer with a p-type conducting structure. The second epitaxial layer includes a second n-type semiconductor layer with a n-type conducting structure, a second light emitting layer with a multi-quantum well structure, and a second p-type semiconductor layer with a p-type conducting structure. Therefore, the light emitting device can emit one-color or two-color light by controlling the first epitaxial layer and the second epitaxial layer respectively.

4 Claims, 10 Drawing Sheets

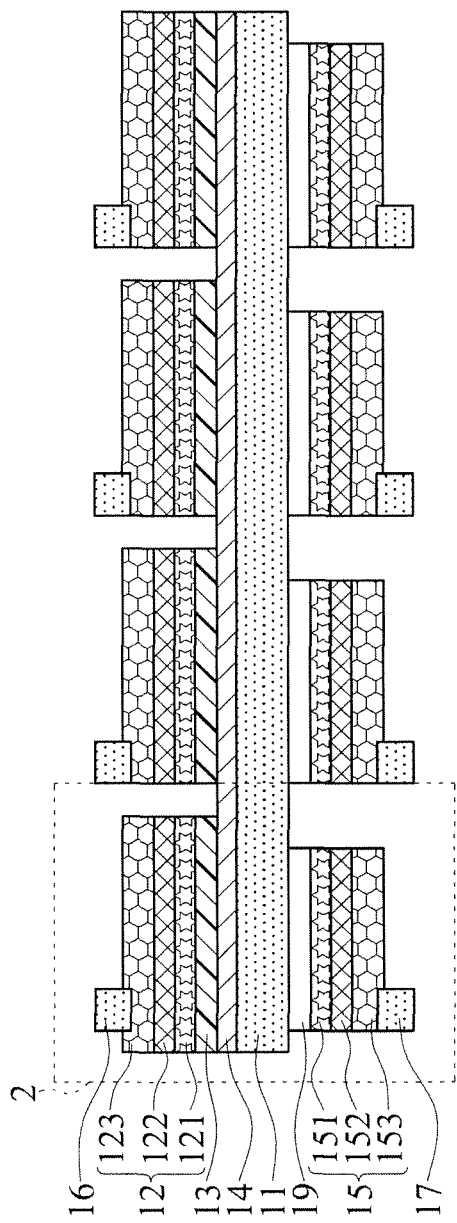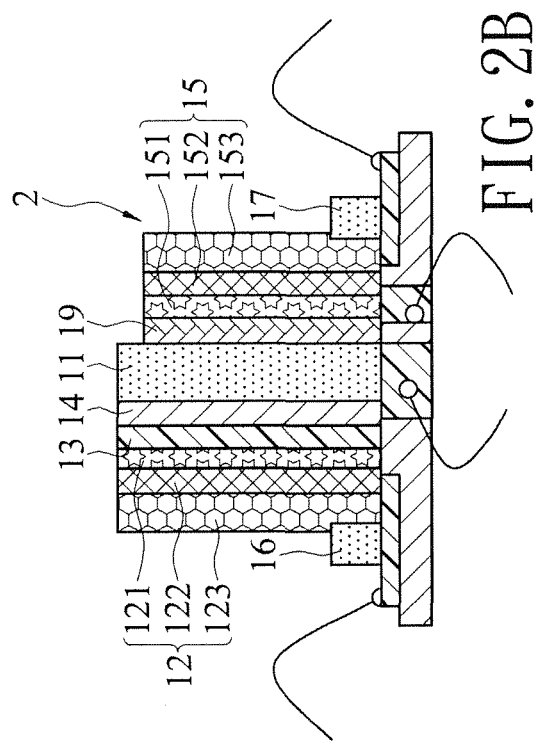

SINGLE-CHIP TWIN LIGHT SOURCE LIGHT EMITTING DEVICE

CROSS-REFERENCE TO RELATED APPLICATIONS

This non-provisional application claims priority under 35 U.S.C. §119(a) on Patent Application No(s). 102112502 filed in Taiwan, R.O.C. on Apr. 9, 2013, the entire contents of which are hereby incorporated by reference.

BACKGROUND OF THE INVENTION

1. Field of the Invention

The present invention relates to a light emitting device, and more particularly to the single-chip twin light source light emitting device capable of emitting two light sources simultaneously by using a single-chip structure and emitting lights from both sides to achieve a full-angle light emission.

2. Description of the Related Art

Light emitting diode (LED) is a light emitting device made of a semiconductor material, and the principle of its light emission mainly resides on a P-N junction of an LED chip, a p-type semiconductor at an end of the LED chip for providing holes, and a n-type semiconductor at the other end of the LED chip for providing electrons, such that when a current passes through the LED chip, the electrons in a conduction band are combined with the holes in a valence band to release extra energy in form of photons.

Due to the factor of the light emission characteristics of the conventional LED chip, the LED chip cannot provide 360-degree full-angle light emission as the fluorescent tubes do, so that the application and design of the LED chip are limited. In general, the LED chip comes with a single-sided light emitting structure, and the light emitting angle can be up to 180 degrees, and the LED chip can emit a light uniformly from a light emitting surface to the outside. To emit light at different angles, the LED chip requires different packaging technologies such as packaging an optical lens into the LED chip or installing the LED chip on a substrate with a multi-faceted structure, so that the LED chip can emit the lights at different light emitting angles.

However, the optical design or packaging process of the LED chip simply increasing the light emitting angle of the LED chip incur greater manufacturing time, manpower and cost. Therefore, it is an urgent and important issue for related manufacturers to design and develop a single-chip twin light source light emitting device to provide a 360-degree light source and reduce the overall manufacturing time and cost of the LED chip manufacturing process.

SUMMARY OF THE INVENTION

In view of the problems of the prior art, it is a primary objective of the present invention to overcome the problems by providing a single-chip structure capable of emitting two light sources simultaneously and emitting lights from both sides to provide a 360-degree full-angle light emission.

To achieve the aforementioned objective, the present invention provides a single-chip twin light source light emitting device comprising a first epitaxial layer, at least one substrate and a second epitaxial layer. The first epitaxial layer includes a first n-type semiconductor layer with a n-type conducting structure, a first light emitting layer with a multi-quantum well structure, and a first p-type semiconductor layer with a p-type conducting structure for emitting a first light. The substrate is disposed on a side of the first epitaxial layer. The second epitaxial layer is disposed at a position opposite to the first epitaxial layer and on the other side of the substrate, and includes a second n-type semiconductor layer with a n-type conducting structure, a second light emitting layer with a multi-quantum well structure, and a second p-type semiconductor layer with a p-type conducting structure for emitting a second light. Wherein, the single-chip twin light source light emitting device of the present invention further comprises a first electrode, disposed on a side of the first n-type semiconductor layer of the first epitaxial layer and away from the substrate; a first reflective layer, disposed on a side of the first p-type semiconductor layer of the first epitaxial layer; a first bonding layer, disposed between the first bonding layer and the substrate; and a first insulating part, inserted between the first reflective layer.

Based on the aforementioned technical contents, the single-chip twin light source light emitting device of the present invention can be implemented in different modes. In the first preferred embodiment of the present invention, the single-chip twin light source light emitting device further comprises a second electrode, disposed on a side of the second n-type semiconductor layer of the second epitaxial layer and away from the substrate; and a second insulating part, disposed between the second p-type semiconductor layer of the second epitaxial layer and the substrate.

In the second preferred embodiment of the present invention, the single-chip twin light source light emitting device further comprises a second reflective layer, disposed on a side of the second p-type semiconductor layer of the second epitaxial layer; an adhesive layer, disposed between the substrate and the second reflective layer; a plurality of second electrodes, disposed between the second p-type semiconductor layer of the second epitaxial layer and the adhesive layer, and on a side of the second reflective layer; and a plurality of insulating parts, disposed on the adhesive layer and adjacent to the second electrodes, and covered onto the second electrode on a side of the second reflective layer.

In the third preferred embodiment of the present invention, the single-chip twin light source light emitting device further comprises a second reflective layer, disposed on a side of the second n-type semiconductor layer of the second epitaxial layer; an adhesive layer, disposed between the substrate and the second reflective layer; and a plurality of second electrodes, disposed on a side of the second p-type semiconductor layer of the second epitaxial layer, and on a side of the second n-type semiconductor layer of the second epitaxial layer.

To achieve the aforementioned objective, the present invention further provides a single-chip twin light source light emitting device, comprising a first epitaxial layer, at least one substrate and a second epitaxial layer. The first epitaxial layer includes a first n-type semiconductor layer with a n-type conducting structure, a first light emitting layer with a multi-quantum well structure, and a first p-type semiconductor layer with a p-type conducting structure. The substrate is disposed on a side of the first epitaxial layer. The second epitaxial layer is disposed at a position opposite to the first epitaxial layer and on the other side of the substrate and includes a second n-type semiconductor layer with a n-type conducting structure, a second light emitting layer with a multi-quantum well structure, and a second p-type semiconductor layer with a p-type conducting structure. The single-chip twin light source light emitting device of the present invention further comprises a plurality of first electrodes, disposed on a side of the first p-type semiconductor layer of the first epitaxial layer, and disposed on a side of the first n-type semiconductor layer and away from the substrate; and a reflective layer, disposed between the substrate on a side of the first epitaxial layer and the substrate on a side of the second epitaxial layer.

Based on the aforementioned technical contents, the single-chip twin light source light emitting device of the present invention can be implemented in different modes.

In the first preferred embodiment of the present invention, the single-chip twin light source light emitting device further comprises a plurality of second electrodes, disposed on a side of the second p-type semiconductor layer of the second epitaxial layer, and disposed on a side of the second n-type semiconductor layer and away from the substrate; and a bonding layer, disposed between the reflective layer and a side of the substrate of the second epitaxial layer.

In the second preferred embodiment of the present invention, the single-chip twin light source light emitting device further comprises a plurality of second electrodes, disposed on a side of the reflective layer and proximate to the second epitaxial layer; and a plurality of insulating parts, disposed on a side of the reflective layer, and covered onto the second electrode on a side of the reflective layer.

To achieve the aforementioned objective, the present invention further provides another single-chip twin light source light emitting device, comprising a first epitaxial layer, at least one substrate, a second epitaxial layer, a plurality of first electrodes and a plurality of second electrodes. The first epitaxial layer includes a first n-type semiconductor layer with a n-type conducting structure, a first light emitting layer with a multi-quantum well structure, and a first p-type semiconductor layer with a p-type conducting structure for emitting a first light. The substrate is disposed on a side of the first epitaxial layer. The second epitaxial layer is disposed at a position opposite to the first epitaxial layer and on the other side of the substrate, and includes a second n-type semiconductor layer with a n-type conducting structure, a second light emitting layer with a multi-quantum well structure, and a second p-type semiconductor layer with a p-type conducting structure for emitting a second light. The first electrodes are disposed on a side of the first n-type semiconductor layer of the first epitaxial layer and away from the substrate, and isolated from the substrate by an insulating part. The second electrodes are disposed between the substrate and the second n-type semiconductor layer of the second epitaxial layer.

The aforementioned and other objectives, technical characteristics and advantages of the present invention will become apparent with the detailed description of preferred embodiments and the illustration of related drawings as follows.

BRIEF DESCRIPTION OF THE DRAWINGS

FIG. 2A is a top view of a single-chip twin light source light emitting device of a second preferred embodiment of the present invention;

FIG. 2B is a cross-sectional view of a single-chip twin light source light emitting device of the second preferred embodiment of the present invention;

DETAILED DESCRIPTION OF THE PREFERRED EMBODIMENTS

Figure 1A:
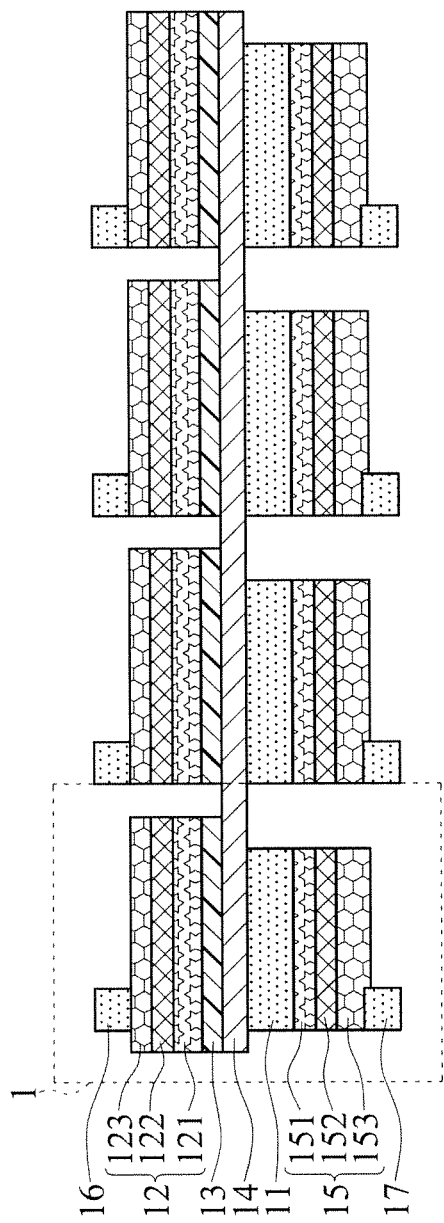
FIG. 1A is a top view of a single-chip twin light source light emitting device of a first preferred embodiment of the present invention.

It is noteworthy that same numerals are used for representing same respective elements in the drawings, and different lines or patterns are used for representing different structures for the purpose of illustrating the present invention, but not intended for representing the actual structure of the single-chip twin light source light emitting device of the present inventions.

Figure 1B:
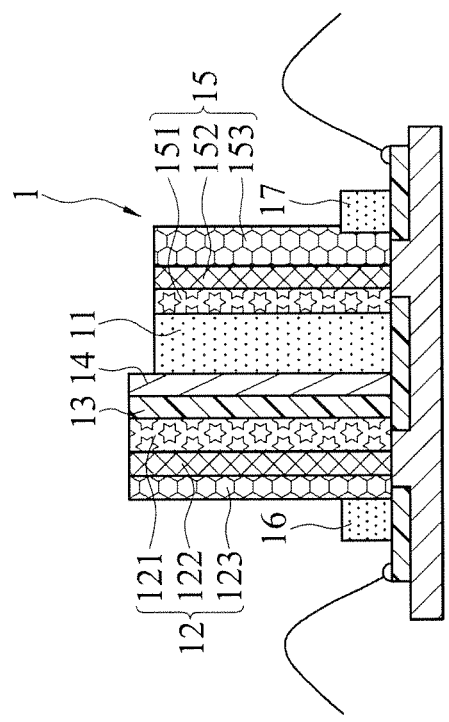
FIG. 1B is a cross-sectional view of a single-chip twin light source light emitting device of the first preferred embodiment of the present invention.

With reference to FIGS. 1A and 1B for a top view and a cross-sectional view of a single-chip twin light source light emitting device of the first preferred embodiment of the present invention respectively. The single-chip twin light source light emitting device 1 comprises a first epitaxial layer 12, a first reflective layer 13, a first bonding layer 14, a substrate 11, a second epitaxial layer 15, a first electrode 16 and a second electrode 17.

The first epitaxial layer 12 is extended outwardly from the substrate 11 and forms a first p-type semiconductor layer 121 with a p-type conducting structure, a first light emitting layer 122 with a multi-quantum well structure, and a first n-type semiconductor layer 123 with a n-type conducting structure for emitting a first light.

The first reflective layer 13 is disposed on a side of the first p-type semiconductor layer 121 of the first epitaxial layer 12. The first bonding layer 14 is coupled to a side of the first reflective layer 13, and the substrate 11 is disposed on the other side of the first bonding layer 14 away from the first reflective layer 13. Wherein, the substrate is made of a thermally conductive and electrically nonconductive material or metal.

The second epitaxial layer 15 is disposed at a position opposite to the first epitaxial layer 12 and on the other side of the substrate 11, and extended outwardly from the substrate 11 and forms a second p-type semiconductor layer 151 with a p-type conducting structure, a second light emitting layer 152 with a multi-quantum well structure, and a second n-type semiconductor layer 153 with a n-type conducting structure for emitting a second light. The first electrode 16 is disposed on a side of the first n-type semiconductor layer 123 of the first epitaxial layer 12 and away from the substrate 11. The second electrode 17 is disposed on a side of the second n-type semiconductor layer 153 of the second epitaxial layer 15 and away from the substrate In this preferred embodiment, a serial connection method is adopted to control the light sources on both sides to emit the first light and the second light; or each light source on both sides can be controlled to emit light separately.

With reference to FIGS. 2A and 2B for a top view and a cross-sectional view of a single-chip twin light source light emitting device of the second preferred embodiment of the present invention respectively. The difference between the single-chip twin light source light emitting device 2 of this preferred embodiment and the single-chip twin light source light emitting device 1 of the first preferred embodiment resides on that this preferred embodiment has a second insulating part 19 disposed between the second p-type semiconductor layer 151 of the second epitaxial layer 15 and the substrate 11. Therefore, the single-chip twin light source light emitting device 2 of this preferred embodiment of the present invention can control the first light and the second light to be emitted from both sides respectively.

Figure 3:
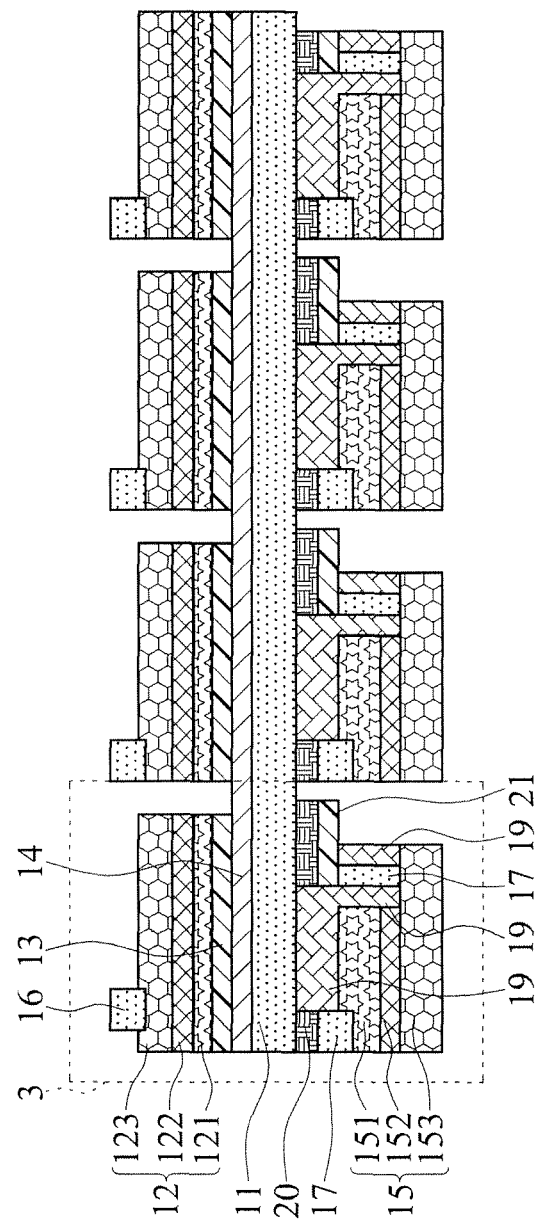
FIG. 3 is a top view of a single-chip twin light source light emitting device of a third preferred embodiment of the present invention.

With reference to FIG. 3 for a top view of a single-chip twin light source light emitting device of the third preferred embodiment of the present invention. The single-chip twin light source light emitting device 3 is the same as the single-chip twin light source light emitting device 1 of the first preferred embodiment, and both of them have the first epitaxial layer 12, the first reflective layer 13, the first bonding layer 14, the substrate 11, the first electrode 16 and the second epitaxial layer 15, so that the description of these elements will not be repeated.

The difference between this preferred embodiment and the first preferred embodiment resides on that an adhesive layer 20 of this preferred embodiment is disposed between the substrate 11 and the second epitaxial layer 15. And a second electrode 17, a second insulating part 19 and a second reflective layer 21 are disposed alternately with each other on a side of the adhesive layer 20 opposite to the side where the substrate 11 is provided.

Wherein, the second reflective layer 21 is disposed on a side of the second p-type semiconductor layer 151 of the second epitaxial layer 15. There are two second electrodes 17 disposed between the second p-type semiconductor layer 151 of the second epitaxial layer 15 and the adhesive layer 20, and on a side of the second reflective layer 21 respectively. There are two second insulating parts 19 disposed on the adhesive layer 20 and adjacent to the second electrodes 17 respectively and covered onto the second electrode 17 on a side of the second reflective layer 21.

In this preferred embodiment, a serial connection method is adopted to control the light sources on both sides to emit the first light and the second light; or each light source on both sides can be controlled to emit light separately instead. Refer to FIG. 3 to compare with the fourth preferred embodiment as shown in FIG. 4.

Figure 4:
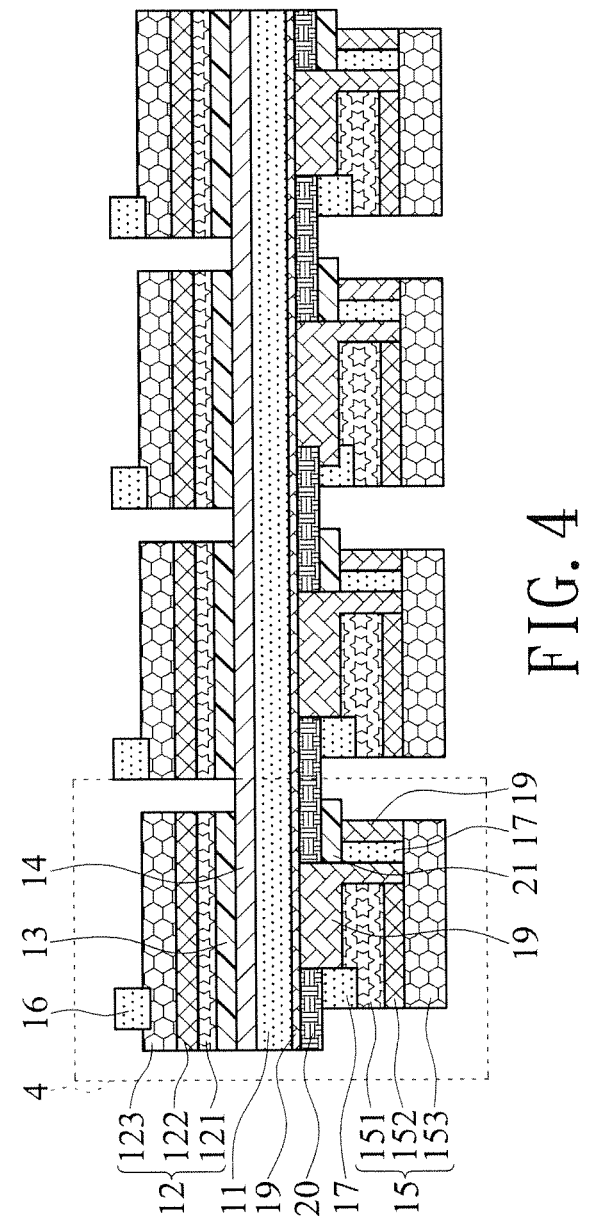
FIG. 4 is a top view of a single-chip twin light source light emitting device of a fourth preferred embodiment of the present invention.

With reference to FIG. 4 for a top view of a single-chip twin light source light emitting device of the fourth preferred embodiment of the present invention. The difference between the single-chip twin light source light emitting device 4 of this preferred embodiment and the single-chip twin light source light emitting device 3 of the third preferred embodiment resides on that the second reflective layer 21 disposed on a side of the adhesive layer 20 of this preferred embodiment is a disconnected structure, and both left and right sides of the second reflective layer 21 are not connected to the surrounding second electrode 17. In addition, the adhesive layer 20 has a thin layer of the second insulating part 19 disposed on a side away from the substrate 11.

In the third preferred embodiment and the fourth preferred embodiment, the second epitaxial layer 15 is a flip chip structure for improving the light output efficiency and avoiding the light from being blocked by bonding pad and metal bonding when the light is outputted or avoiding a reduction of brightness. In addition, the heat produced can be dissipated to the outside from the substrate 11.

Figure 5:
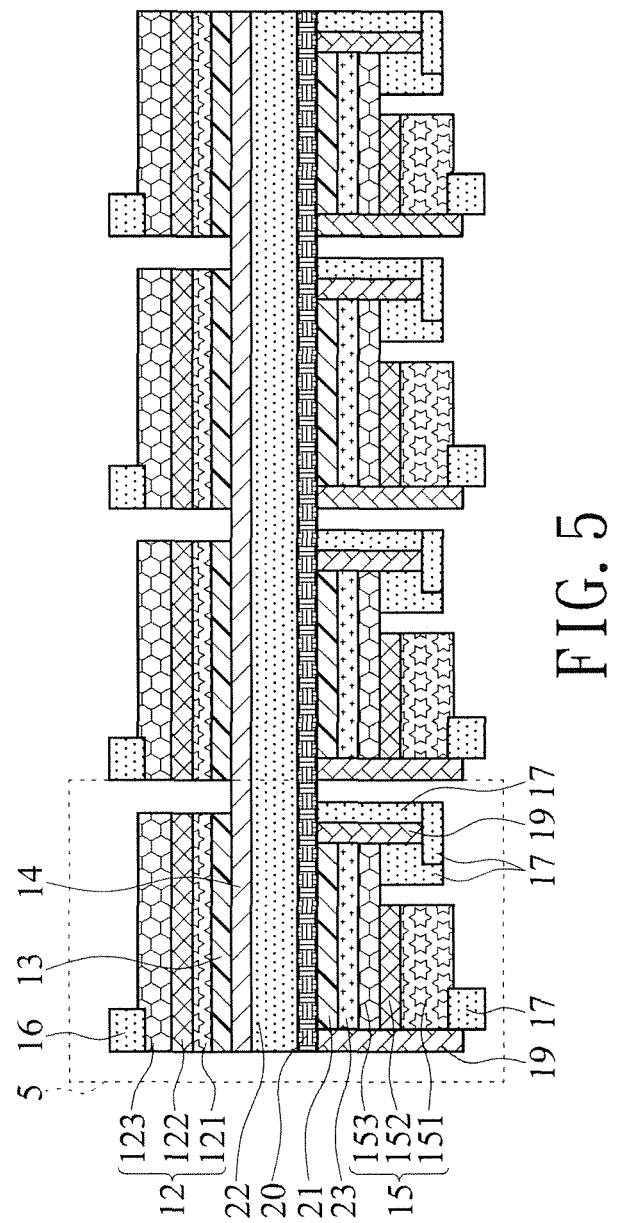
FIG. 5 is a top view of a single-chip twin light source light emitting device of a fifth preferred embodiment of the present invention.

With reference to FIG. 5 for a top view of a single-chip twin light source light emitting device of the fifth preferred embodiment of the present invention. The single-chip twin light source light emitting device 5 of this preferred embodiment is the same as the single-chip twin light source light emitting device 3 of the third preferred embodiment, and both have the first epitaxial layer 12, the first reflective layer 13, the first bonding layer 14, the first electrode 16 and the second epitaxial layer 15, and thus the description of this elements will not be repeated.

The difference between this preferred embodiment and the third preferred embodiment resides on that this preferred embodiment includes a first substrate 22 and a second substrate 23; and a second reflective layer 21 and a second substrate 23 are disposed between the adhesive layer 20 and the second n-type semiconductor layer 153 of the second epitaxial layer 15. The second electrodes 17 are disposed on a side of the second p-type semiconductor layer 151 of the second epitaxial layer 15, and disposed on a side of the second n-type semiconductor layer 153 of the second epitaxial layer 15. There are two second insulating parts 19 disposed at both ends of the second reflective layer 21 and the second epitaxial layer 15 respectively; and an external surface of one of the second insulating parts 19 is covered with the second electrode 17.

Figure 6:
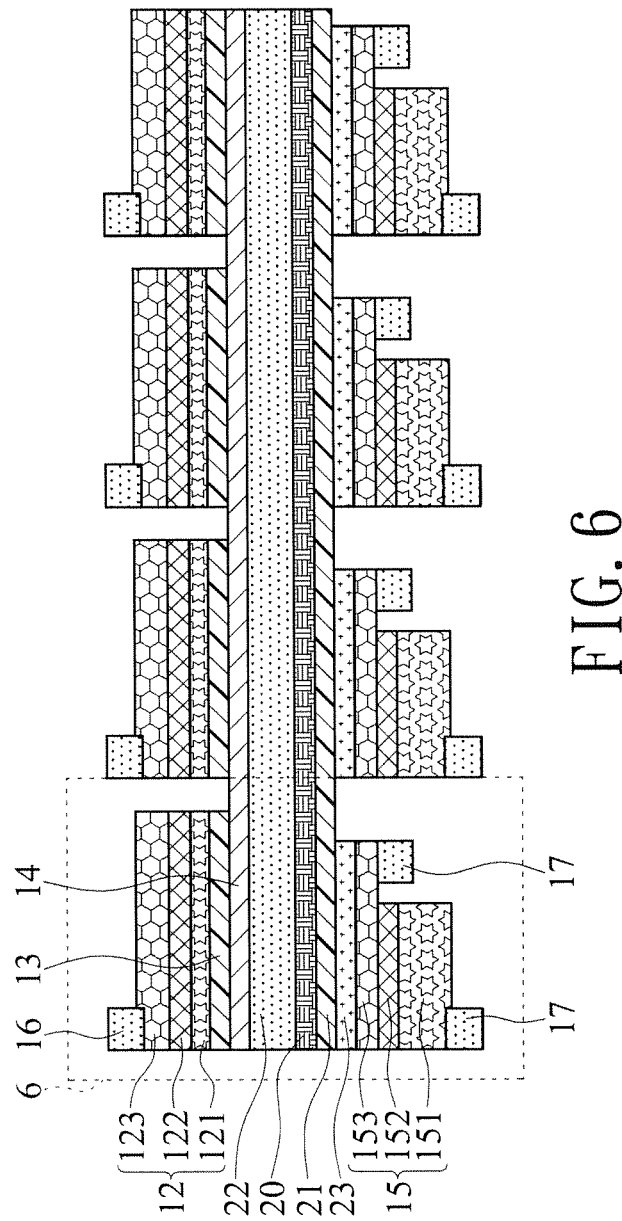
FIG. 6 is a top view of a single-chip twin light source light emitting device of a sixth preferred embodiment of the present invention.

In this preferred embodiment, a serial connection method is adopted to control the light source on both sides to emit the first light and the second light. Of course, the light sources on both sides can be controlled to emit light separately. Refer to FIG. 6 to compare with the fifth preferred embodiment as shown in FIG. 5.

With reference to FIG. 6 for a top view of a single-chip twin light source light emitting device of the sixth preferred embodiment of the present invention. The difference between this preferred embodiment and the fifth preferred embodiment resides on that this preferred embodiment does not have a plurality of insulating layers; and a plurality of second electrodes 17 are disposed on a side of the second p-type semiconductor layer 151 of the second epitaxial layer 15, and on a side of the second n-type semiconductor layer 153 of the second epitaxial layer 15 respectively. Wherein, the second n-type semiconductor layer 153 of the second epitaxial layer 15 is wider than the second p-type semiconductor layer 151 and the second light emitting layer 152 of the second epitaxial layer 15, and the protruding portion can be used for installing the second electrode 17.

Figure 7:
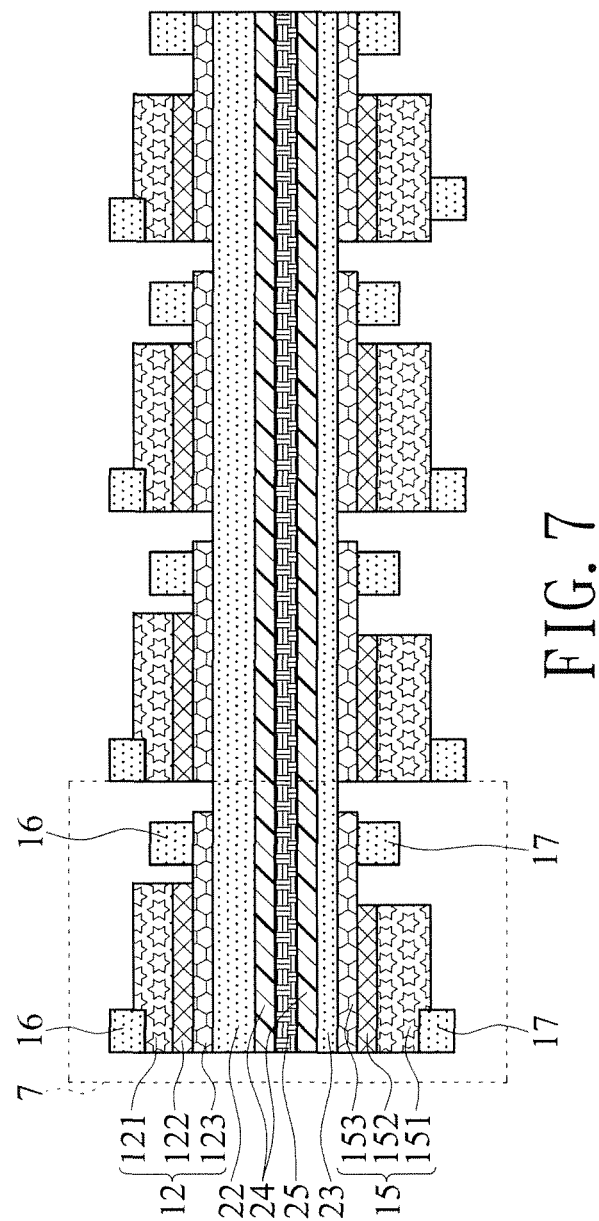
FIG. 7 is a top view of a single-chip twin light source light emitting device of a seventh preferred embodiment of the present invention.

With reference to FIG. 7 for a single-chip twin light source light emitting device of the seventh preferred embodiment of the present invention. The single-chip twin light source light emitting device 7 comprises a first epitaxial layer 12, a first substrate 22, a plurality of first electrodes 16, a plurality of reflective layers 24, a bonding layer 25, a second substrate 23, a second epitaxial layer 15 and a plurality of second electrodes 17. Wherein, the first epitaxial layer 12 includes a first p-type semiconductor layer 121 with a p-type conducting structure, a first light emitting layer 122 with a multi-quantum well structure, and a first n-type semiconductor layer 123 with a n-type conducting structure for emitting a first light. The first substrate 22 is disposed on a side of the first epitaxial layer 12. The first electrodes 16 are disposed on a side of the first p-type semiconductor layer 121 of the first epitaxial layer 12 and on a side of the first n-type semiconductor layer 123 and away from the first substrate 22 respectively. The reflective layers 24 are disposed between the first substrate 22 and the bonding layer 25 and between the second substrate 23 and the bonding layer 25 respectively. The bonding layer 25 is disposed between the reflective layer 24 and the second substrate 23 on a side of the second epitaxial layer 15. The second epitaxial layer 15 is disposed at a position opposite to the first epitaxial layer 12 and on the other side of the second substrate 23, and includes a second n-type semiconductor layer 153 with a n-type conducting structure, a second light emitting layer 152 with a multi-quantum well structure, and a second p-type semiconductor layer 151 with a p-type conducting structure for emitting a second light. The second electrodes 17 are disposed on a side of the second p-type semiconductor layer 151 of the second epitaxial layer 15 and on a side of the second n-type semiconductor layer 153 and away from the second substrate 23 respectively.

Figure 8:
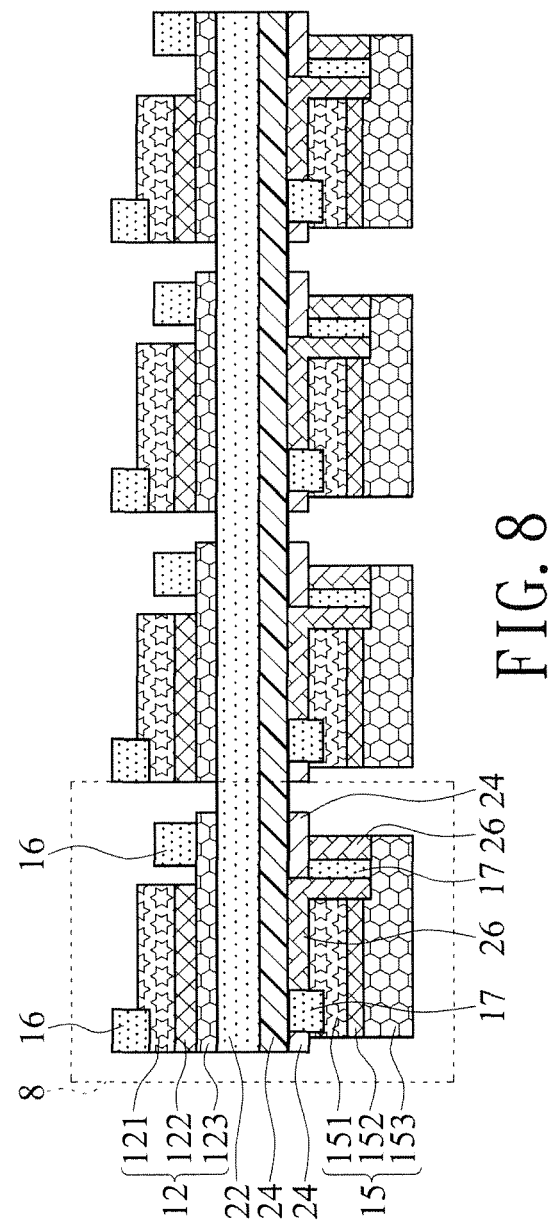
FIG. 8 is a top view of a single-chip twin light source light emitting device of an eighth preferred embodiment of the present invention.

With reference to FIG. 8 for a single-chip twin light source light emitting device of the eighth preferred embodiment of the present invention. The single-chip twin light source light emitting device 8 of this preferred embodiment is the same as that of the seventh preferred embodiment, and both have the first epitaxial layer 12, the first substrate 22, the first electrodes 16 and the reflective layer 24, so that the description of these elements will not be repeated. The difference between this preferred embodiment and the seventh preferred embodiment resides on that this preferred embodiment does not have the bonding layer 25 and the second substrate 23. And a second electrode 17, an insulating part 26 and a second reflective layer 21 are disposed alternately with one another on a side of the reflective layer 24 opposite to the side where the first substrate 22 is provided.

Wherein, the second reflective layer 21 is disposed on a side of the second p-type semiconductor layer 151 of the second epitaxial layer 15. There are two second electrodes 17 disposed between the second p-type semiconductor layer 151 of the second epitaxial layer 15 and the adhesive layer 20, and disposed on a side of the second reflective layer 21 respectively. There are two insulating parts 26 disposed on the adhesive layer 20 and adjacent to the second electrodes 17 respectively and covered onto the second electrode 17 on a side of the second reflective layer 21.

In addition, the second epitaxial layer 15 is extended outwardly from the reflective layer 24 and forms a second p-type semiconductor layer 151 with a p-type conducting structure, a second light emitting layer 152 with a multi-quantum well structure, and a second n-type semiconductor layer 153 with a n-type conducting structure.

In this preferred embodiment, the second epitaxial layer 15 has a flip chip structure for avoiding the light from being blocked by bonding pad and metal bonding which causes a reduction of brightness when the light is outputted. In addition, the heat produced can be dissipated to the outside from the substrate 11, so that the light output efficiency can be improved. Wherein, the substrate 11 is made of a thermally conductive and electrically nonconductive material, metal, or sapphire. If the substrate 11 is a sapphire substrate which is transparent, the reflective layer 24 with a higher reflectivity can be formed on the p-type electrode, such that the light originally emitted from the top of the device can be guided to other light emitting angles, and then received by an edge of the sapphire substrate, and this method can reduce the loss of light on the sides of the electrode to provide a light output approximately twice as much as the conventional packaging method.

Figure 9:
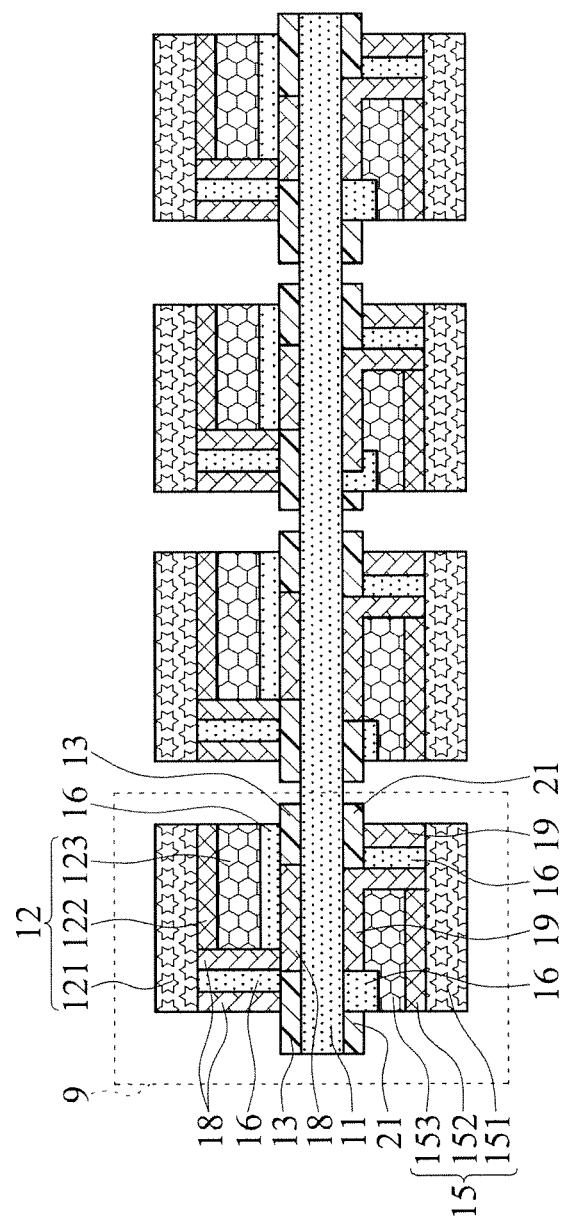
FIG. 9 is a top view of a single-chip twin light source light emitting device of a ninth preferred embodiment of the present invention.

With reference to FIG. 9 for a single-chip twin light source light emitting device of the ninth preferred embodiment of the present invention. The single-chip twin light source light emitting device 9 has a flip chip structure. In FIG. 9, the single-chip twin light source light emitting device 9 comprises a substrate 11, a first flip chip structure 101 and a second flip chip structure 102. The substrate 11 is a thermally conductive and electrically non-conductive substrate, a metal substrate 11 or a sapphire substrate 11.

The first flip chip structure 101 is disposed on a side of the substrate 11, and the second flip chip structure 102 is disposed on the other side of the substrate 11. Wherein, the first flip chip structure 101 includes a first epitaxial layer 12, a first electrode 16, a first insulating part 18 and a first reflective layer 13, and the second flip chip structure 102 includes a second epitaxial layer 15, a second electrode 17, a second insulating part 19 and a second reflective layer 21.

The first epitaxial layer 12 is extended outwardly from the substrate 11 and forms a first n-type semiconductor layer 123 with a n-type conducting structure, a first light emitting layer 122 with a multi-quantum well structure, and a first p-type semiconductor layer 121 with a p-type conducting structure for emitting a first light. The second epitaxial layer 15 is extended outwardly from the substrate 11 and forms a second n-type semiconductor layer 153 with a n-type conducting structure, a second light emitting layer 152 with a multi-quantum well structure, and a second p-type semiconductor layer 151 with a p-type conducting structure for emitting a second light. Wherein, the first p-type semiconductor layer 121 of the first epitaxial layer 12 is wider than the first n-type semiconductor layer 123 and the first light emitting layer 122 of the first epitaxial layer 12, and the protruding portion can be used for installing the first electrode 16; and the second p-type semiconductor layer 151 of the second epitaxial layer 15 is wider than the second n-type semiconductor layer 153 and the second light emitting layer 152 of the second epitaxial layer 15, and the protruding portion can be used for installing the second electrode 17.

In the first flip chip structure 101, the first reflective layer 13 and the first insulating part 18 are disposed alternately with each other on a side of the substrate 11 and the first electrodes 16 are disposed on the other side of the first reflective layer 13 and the first insulating part 18. In the second flip chip structure 102, the second reflective layer 21 and the second insulating part 19 are disposed alternately with each other on the other side of the substrate 11, and the second electrodes 17 are disposed on the other side of the second reflective layer 21 and the second insulating part 19.

Figure 10:
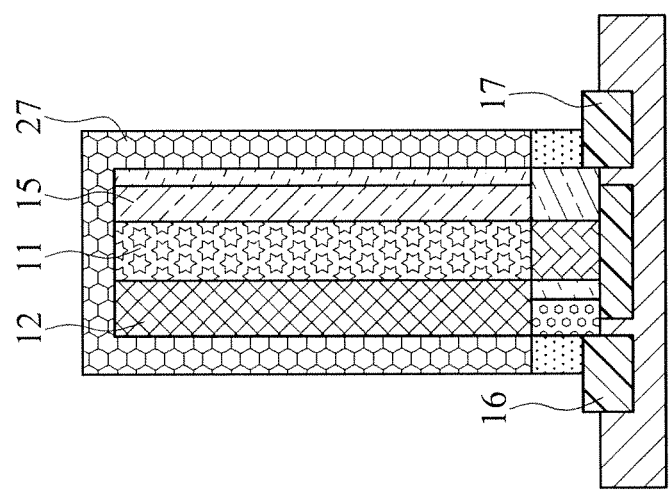
FIG. 10 is a cross-sectional view of a single-chip twin light source light emitting device of a tenth preferred embodiment of the present invention.

With reference to FIG. 10 for a cross-sectional view of a single-chip twin light source light emitting device of the tenth preferred embodiment of the present invention. The single-chip twin light source light emitting device 10 comprises a substrate 11, a first epitaxial layer 12 and a second epitaxial layer 15. The first epitaxial layer 12 is disposed on a side of the substrate 11 and includes a first n-type semiconductor layer 123 with a n-type conducting structure, a first light emitting layer 122 with a multi-quantum well structure, and a first p-type semiconductor layer 121 with a p-type conducting structure for emitting a first light. The second epitaxial layer 15 is disposed on the other side of the substrate 11 and at a position opposite to the first epitaxial layer 12 and includes a second n-type semiconductor layer 153 with a n-type conducting structure, a second light emitting layer 152 with a multi-quantum well structure, and a second p-type semiconductor layer 151 with a p-type conducting structure for emitting a second light. Wherein, the first light and the second light can be light sources with the same or different wavelengths.

It is noteworthy that of the single-chip twin light source light emitting device 10 of the present invention can be coated or sprayed with a phosphor layer 27 on external sides of the first epitaxial layer 12 and the second epitaxial layer 15, so that the first light and the second light can be emitted to excite the phosphor layer 27 to emit a light with another wavelength. For example, if the first light is a red light, the second light is a blue light, and the phosphor layer 27 is made of YAG phosphor ($Y_3Al_5O_{12}$:Ce; yttrium aluminum garnet), then the first epitaxial layer 12 and the second epitaxial layer 15 can emit the first light (red light) and the second light (blue light) to excite the phosphor layer 27 to produce a white light LED with high brightness by mixing the red and blue lights.

What is claimed is:

1. A single-chip twin light source light emitting device, comprising:
    a first epitaxial layer, including a first n-type semiconductor layer with a n-type conducting structure, a first light emitting layer with a multi-quantum well structure, and a first p-type semiconductor layer with a p-type conducting structure, for emitting a first light;
    a single silicon based substrate, disposed on a side of the first epitaxial layer;
    a second epitaxial layer, disposed at a position opposite to the first epitaxial layer and on the other side of the substrate, and including a second n-type semiconductor layer with a n-type conducting structure, a second light emitting layer with a multi-quantum well structure, and a second p-type semiconductor layer with a p-type conducting structure, for emitting a second light;
    a first electrode, disposed on a side of the first n-type semiconductor layer of the first epitaxial layer and away from the substrate;
    a first reflective layer, disposed on a side of the first p-type semiconductor layer of the first epitaxial layer;
    a first bonding layer, disposed between the first reflective layer and the substrate; and
    a first insulating part, inserted on a side of the first reflective layer.

2. The single-chip twin light source light emitting device of claim 1, further comprising:
    a second electrode, disposed on a side of the second n-type semiconductor layer of the second epitaxial layer and away from the substrate; and
    a second insulating part, disposed between the second p-type semiconductor layer of the second epitaxial layer and the substrate.

3. The single-chip twin light source light emitting device of claim 1, further comprising:
    a second reflective layer, disposed on a side of the second p-type semiconductor layer of the second epitaxial layer;
    an adhesive layer, disposed between the substrate and the second reflective layer;
    a plurality of second electrodes, disposed between the second p-type semiconductor layer of the second epitaxial layer and the adhesive layer, and on a side of the second reflective layer; and
    a plurality of insulating parts, disposed on the adhesive layer and adjacent to the second electrodes, and covered onto the second electrode on a side of the second reflective layer.

4. The single-ship twin light source light emitting device of claim 1, further comprising:
    a second reflective layer, disposed on a side of the second n-type semiconductor layer of the second epitaxial layer;
    an adhesive layer, disposed between the substrate and the second reflective layer; and
    a plurality of second electrodes, disposed on a side of the second p-type semiconductor layer of the second epitaxial layer, and on a side of the second n-type semiconductor layer of the second epitaxial layer.

* * * * *